(12) United States Patent
Zojer

(10) Patent No.: US 10,454,456 B2
(45) Date of Patent: Oct. 22, 2019

(54) METHOD FOR DRIVING A TRANSISTOR DEVICE WITH NON-ISOLATED GATE, DRIVE CIRCUIT AND ELECTRONIC CIRCUIT

(71) Applicant: Infineon Technologies Austria AG, Villach (AT)

(72) Inventor: Bernhard Zojer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/047,672

(22) Filed: Jul. 27, 2018

(65) Prior Publication Data

US 2019/0068173 A1 Feb. 28, 2019

(30) Foreign Application Priority Data

Aug. 25, 2017 (DE) .................. 10 2017 119 600

(51) Int. Cl.
*H03K 3/012* (2006.01)
*H03K 17/567* (2006.01)
*H03K 17/06* (2006.01)

(52) U.S. Cl.
CPC .......... *H03K 3/012* (2013.01); *H03K 17/063* (2013.01); *H03K 17/567* (2013.01)

(58) Field of Classification Search
CPC .. H03K 17/00; H03K 17/04126; H03K 17/06; H03K 17/063; H03K 17/0826; H03K 17/16; H03K 17/567; H03K 17/601; H03K 17/687; H03K 2217/00; H03K 2217/0036; H03K 3/00; H03K 3/012
USPC ....................................................... 327/109
See application file for complete search history.

(56) References Cited

U.S. PATENT DOCUMENTS 5,805,405 A 9/1998 Benkaroun et al.
9,490,798 B1 * 11/2016 Charpentier ..... H03K 17/04206

FOREIGN PATENT DOCUMENTS

| DE | 69602407 T2 | 9/1999 |
| EP | 2884664 A1 | 6/2015 |
| WO | 2017070290 A1 | 4/2017 |

OTHER PUBLICATIONS

Office Action, in the German language, from counterpart German Application No. 102017119600.5, dated Jul. 18, 2018, 6 pp.

* cited by examiner

*Primary Examiner* — Lincoln D Donovan
*Assistant Examiner* — Dave Mattison
(74) *Attorney, Agent, or Firm* — Shumaker & Sieffer, P.A.

(57) ABSTRACT

Disclosed is a method for driving a transistor device and an electronic circuit that includes a transistor device. The method includes driving the transistor device based on a drive signal such that the transistor device is driven in an on-state when the drive signal has an on-level and an off-state when the drive signal has an off-level. Driving the transistor device in the off-state includes: operating the transistor device in a first off-state after the drive signal changes from the on-level to the off-level; after the first off-state, operating the transistor device in a second off-state different from the first off-state; and after the second off-state, operating the transistor device in a third off-state different from the second off-state if the off-level of the drive signal prevails longer than a predefined maximum time period.

18 Claims, 8 Drawing Sheets

METHOD FOR DRIVING A TRANSISTOR DEVICE WITH NON-ISOLATED GATE, DRIVE CIRCUIT AND ELECTRONIC CIRCUIT

This Application claims priority to German Application Number 102017119600.5 filed on Aug. 25, 2017, the entire content of which is incorporated by reference herein.

This disclosure in general relates to a method and a drive circuit for driving a transistor device with non-isolated gate.

Transistor devices with non-isolated gates such as GaN (gallium nitride) based HEMTs (High Electron Mobility Transistors) are becoming more and more popular for use in electronic switches in various types of electronic applications such as automotive, industrial, household or consumer electronic applications, to name only a few. GaN based HEMTs are available as normally-on devices or normally-off devices. GaN based normally-off HEMTs may have a relatively low threshold voltage such as about 1V. Unlike an MOS transistor such as a MOSFET (Metal Oxide Semiconductor Field-Effect Transistor) or an IGBT (Insulated Gate Bipolar Transistor) a normally-off HEMT, in the on-state, may require a gate current to maintain the on-state.

There is a need to provide a method and a drive circuit to reliably drive a transistor device with non-isolated gate, in particular, a normally-off HEMT.

One example relates to a method. The method includes driving a transistor device based on a drive signal such that the transistor device is driven in an on-state when the drive signal has an on-level and an off-state when the drive signal has an off-level. Driving the transistor device in the off-state comprises: operating the transistor device in a first off-state after the drive signal changes from the on-level to the off-level; after the first off-state, operating the transistor device in a second off-state different from the first off-state; and after the second off-state, operating the transistor device in a third off-state different from the second off-state if the off-level of the drive signal prevails longer than a predefined maximum time period.

Another example relates to a drive circuit. The drive circuit is configured to drive a transistor device based on a drive signal such that the transistor device is driven in an on-state when the drive signal has an on-level and an off-state when the drive signal has an off-level. In the off-state, the drive circuit is configured to drive the transistor device: in a first off-state after the drive signal changes from the on-level to the off-level; after the first off-state, in a second off-state different from the first off-state; and after the second off-state, in a third off-state different from the second off-state if the off-level of the drive signal prevails longer than a predefined maximum time period.

Examples are explained below with reference to the drawings. The drawings serve to illustrate certain principles, so that only aspects necessary for understanding these principles are illustrated. The drawings are not to scale. In the drawings the same reference characters denote like features.

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
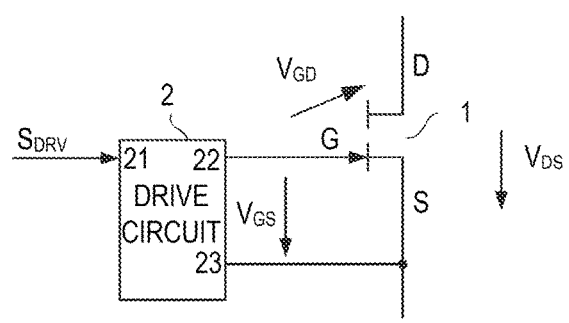
FIG. 1 shows one example of an electronic circuit that includes a transistor device and a drive circuit configured to drive the transistor device based on a drive signal.

FIG. 1 shows one example of an electronic circuit that includes a transistor device and a drive circuit 2 configured to drive the transistor device 1 based on a drive signal $S_{DRV}$. The transistor device 1 includes a drive path between a control node G and a first load node S and a load path between a second load node D and the first load node S. The transistor device 1 switches on or off dependent on a drive voltage $V_{GS}$ applied to the drive path, that is, between the control node G and the first load node S.

According to one example, the transistor device 1 is a HEMT (High Electron Mobility such as a GaN (gallium nitride) based HEMT. The HEMT may be implemented as a normally-off HEMT with a p-type GaN based gate region and a diode-like junction between the gate region and a source region. This type of HEMT is commonly known as GIT (Gate Injection Transistor). In a HEMT, the control node G is also referred to as gate node, the first load node S is also referred to as source node, the second load node D is also referred to as drain node, and the drive voltage $V_{GS}$ is also referred to as gate-source voltage. Although the transistor device 1 is not restricted to be implemented as a HEMT, the terms gate node G, source node S and drain node D will be used in the following to denote the control node, the first load node and the second load node, respectively.

Referring to FIG. 1, the drive circuit 2 generates the drive voltage $V_{GS}$ between a first output node 22 coupled to the gate node G and a second output node 23 coupled to the source node S dependent on the drive signal $S_{DRV}$ received at an input 21 of the drive circuit 2. The drive signal $S_{DRV}$ may be any type of signal suitable for conveying a switching information, wherein the switching information defines whether it is desired to switch on or switch off the transistor device 1.

Figure 2A:
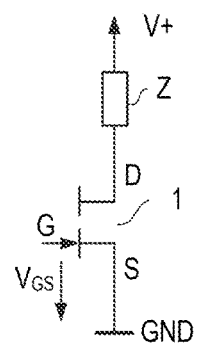
FIGS. 2A to 2C show different examples of how the electronic circuit with the transistor device may be used as an electronic switch.
Figure 2B:
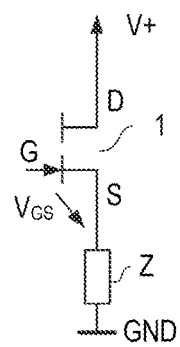
Figure 2C:
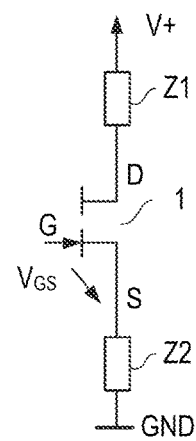

The electronic circuit with the transistor device 1 and the drive circuit 2 may be used as an electronic switch in various types of electronic circuits. Some examples of how the electronic circuit may be used as an electronic switch are illustrated in FIGS. 2A to 2C wherein for the ease of illustration only the transistor device 1 is shown and the drive circuit is omitted in these figures. Referring to FIG. 2A, the electronic circuit may be used as a low-side switch. In this case, the load path D-S of the transistor device 1 is connected between a load Z and a circuit node where a negative supply potential or ground GND is available, wherein a series circuit with the load path D-S of the transistor device 1 and the load Z is connected between a circuit node for a positive supply potential V+ and the circuit node for the negative supply potential or ground GND. Referring to FIG. 2B, the electronic circuit may be used as a high-side switch. In this example, the load path D-S of the transistor device 1 is connected between the circuit node for the positive supply potential V+ and the load Z. According to another example shown in FIG. 2C, the load path D-S is connected between two loads Z1, Z2, wherein a series circuit that includes the loads Z1, Z2 and the load path D-S is connected between circuit nodes for the positive supply potential V+ and the negative supply potential or ground GND.

Figure 3:
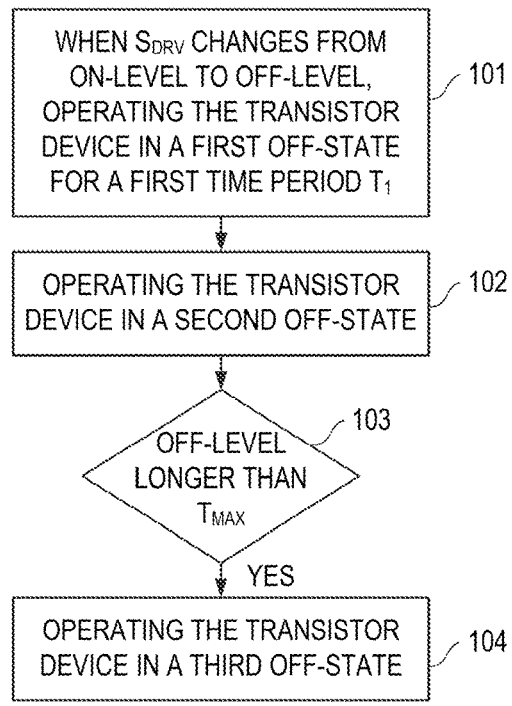
FIG. 3 shows a flow chart that illustrates one example of a method for driving the transistor device based on the drive signal.

FIG. 3 shows a flowchart that illustrates one example of a method performed by the drive circuit 2 for driving the transistor device 1. Referring to FIG. 3, the method includes, when the drive signal $S_{DRV}$ changes from an on-level to an off-level, operating the transistor device 1 in a first off-state for a first time period T1. This is illustrated in step 101 of the flowchart. The on-level of the drive signal $S_{DRV}$ is a signal level indicating that it is desired to switch on the transistor device 1, and the off-level is a signal level indicating that it is desired to switch off the transistor device 1. Referring to step 102 in FIG. 3, the method further includes, after the first time period $T_1$, operating the transistor device 1 in a second off-state. Further, referring to steps 103 and 104, if the off-level of the drive signal $S_{DRV}$ prevails longer than a maximum time period $T_{MAX}$, the method includes operating the transistor device 1 in a third off-state. Each of the first off-state, the second off-state and the third off-state is associated with a voltage level or voltage range of the drive voltage $V_{GS}$. The first off-state is different from the second off-state. That is, a voltage level or voltage range of the drive voltage $V_{GS}$ in the first off-state is different from the voltage level or voltage range of the drive voltage $V_{GS}$ in the second off-state. Further, the second off-state is different from the third off-state. That is, the voltage level or voltage range of the drive voltage $V_{GS}$ in the second off-state is different from the voltage level or voltage range of the drive voltage $V_{GS}$ in the third off-state.

Figure 4A:
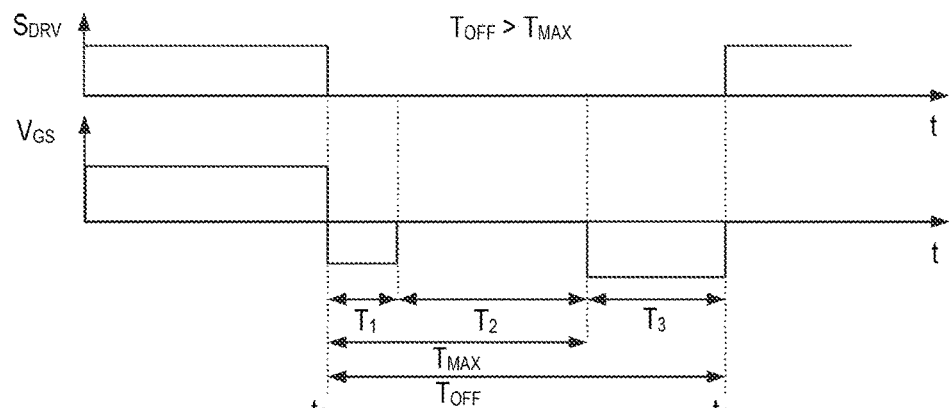
FIGS. 4A and 4B show examples of timing diagrams of the drive signal and a drive voltage generated based on the drive signal in accordance with the method illustrated in FIG. 3.
Figure 4B:
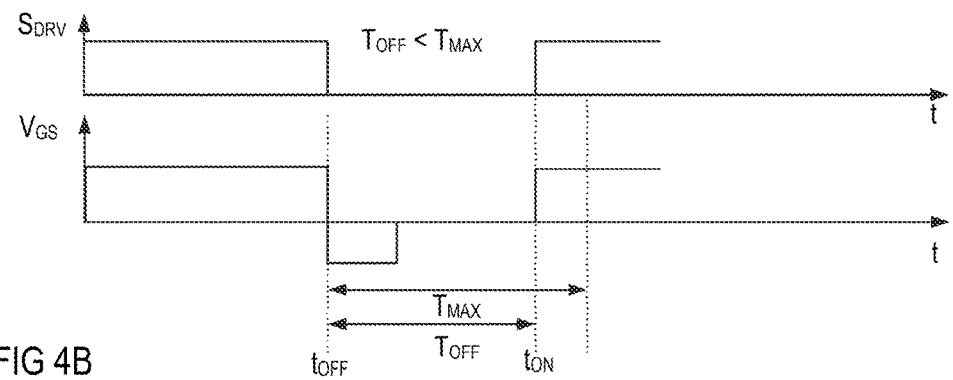

FIGS. 4A and 4B show signal waveforms of the drive signal $S_{DRV}$ and the drive voltage $V_{GS}$ in accordance with one example of the method illustrated in FIG. 3. FIG. 4A shows signal waveforms in an operating scenario in which the off-level of the drive signal $S_{DRV}$ prevails longer than the maximum time period $T_{MAX}$, and FIG. 4B shows signal waveforms in an operating scenario in which the off-level of the drive signal $S_{DRV}$ prevails shorter than the maximum time period $T_{MAX}$.

In FIGS. 4A and 4B, $t_{OFF}$ denotes a time instance when a signal level of the drive signal $S_{DRV}$ changes from the on-level to the off-level. Just for the purpose of illustration, the on-level is a higher signal level than the off-level in the examples shown in FIGS. 4A and 4B. According to one example, the drive voltage $V_{GS}$ is generated to have an on-level when the drive signal $S_{DRV}$ has an on-level. The "on-level" of the drive voltage $V_{GS}$ is a voltage level higher than a threshold voltage of the transistor device 1. The "threshold voltage" of the transistor device 1 is the voltage level of the drive voltage $V_{GS}$ at which the transistor device 1 switches on, that is, starts to conduct a current through the load path when a voltage is applied across the load path D-S. When implemented as a normally-off HEMT the transistor device 1 may have a threshold voltage as low as about 1 volt (V).

Referring to FIGS. 4A and 4B, during the first off-state, which begins when the signal level of the drive signal $S_{DRV}$ changes from the on-level to the off-level, the drive voltage $V_{GS}$ has a first off-level. According to one example, the first off-level is a negative voltage level. Just for the purpose of illustration, the off-level in the first off-state is drawn as a constant voltage level in FIGS. 4A and 4B. However, as will be explained in the following, the voltage level may vary in the first off-state. Nevertheless, the voltage level in the first off-state is different from the voltage level in the second off-state. According to one example, in the second off-state, the voltage level is substantially zero. In the third off-state, which is illustrated in FIG. 4A, the voltage level of the drive voltage $V_{GS}$ is different from the voltage level in the second off-state. According to one example, the voltage level in the third off-state is a negative voltage level. This negative voltage level can be equal to or different from the voltage level in the first off-state. Referring to the above, the transistor device 1 is operated in the third off-state only when the off-level of the drive signal $S_{DRV}$ prevails longer than a maximum time period $T_{MAX}$, that is, when the transistor device is switched off longer than the maximum time period $T_{MAX}$. This is illustrated in FIG. 4A, while FIG. 4B shows a scenario in which the signal level of the drive signal $S_{DRV}$ changes from the on-level to the off-level before the maximum time period $T_{MAX}$ expires. In FIG. 4A, $T_2$ denotes a time period for which the transistor device is operated in the second off-state. This second time period $T_2$ is substantially given by the maximum time period $T_{MAX}$ minus the first time period $T_1$. Further, $T_3$ denotes a time period for which the transistor device is operated in the third off-state. This time period is given by the time period $T_{OFF}$ for which the off-level of the drive signal $S_{DRV}$ prevails minus the maximum time period $T_{MAX}$.

The benefits of operating the transistor device in two or three different off-states dependent on how long the off-level of the drive signal $S_{DRV}$ prevails are as follows. Referring to the above, the electronic circuit with the transistor device 1 and the drive circuit 2 may be used as an electronic switch for switching various types of loads. Moreover, the electronic circuit may be part of a complex electronic circuit with a plurality of devices. When the transistor device 1 switches off, a voltage across the load path D-S of the transistor device 1 and a voltage across a load connected in series with the transistor device 1, such as any of the loads Z, Z1, Z2 shown in FIGS. 2A to 2C, may rapidly change. Further, the electronic circuit may include parasitic devices such as parasitic capacitances and parasitic inductances. These parasitic devices in combination with a rapidly changing voltage across the transistor device 1 or the load may affect the drive voltage $V_{GS}$ and, more specifically, may inadvertently switch on the transistor device 1 when the off-level of the drive voltage $V_{GS}$ adjusted by the drive circuit 2 is too close to the threshold level. The voltage level in the first off-state is therefore chosen to switch off the transistor device 1 and safely keep the transistor device 1 in the off-state until the electronic circuit is in a steady state. According to one example, the voltage level of the drive voltage $V_{GS}$ in the first off-state is at least 2 volts, at least 3 volts or at least 5 volts below the threshold level. If the threshold level is about 1 volt, the voltage level in the first off-state is negative in this example.

According to one example, a duration of the first time period $T_1$ is selected from between 20 nanoseconds (ns) and 200 nanoseconds, in particular between 50 nanoseconds and 100 nanoseconds. The maximum time period $T_{MAX}$ after which the transistor device 1 is operated in the third off-state may be selected from between 10 microseconds (µs) and 500 microseconds, in particular between 100 microseconds and 300 microseconds.

A normally-off HEMT, which may be used as the transistor device 1, is a unidirectional blocking electronic switch that switches on and off dependent on the drive voltage $V_{GS}$ when a load path voltage $V_{DS}$ (see FIG. 1) between the drain node D and the source node S has a first polarity but conducts a current when the load path voltage $V_{DS}$ has a second polarity opposite the first polarity. An operating mode when the HEMT conducts a current by virtue of a load path voltage with the second polarity is referred to as reverse conducting mode. Losses that occur in the HEMT in the reverse conducting mode are substantially dependent on the load path voltage $V_{DS}$ in the reverse conducting mode. The HEMT operates in the reverse conducting mode, when the load path voltage is such that a gate-drain voltage $V_{GD}$ (see FIG. 1), which is the voltage between the gate node and the drain node D reaches the threshold voltage. This occurs when a magnitude of the drain-source voltage $V_{DS}$ is equal to or greater than the threshold voltage VIE minus the gate-source voltage $V_{GS}$, that is, $|V_{DS}| \geq V_{TH} - V_{GS}$. Thus, the greater the difference $V_{TH} - V_{GS}$ between the threshold voltage $V_{TH}$ and the drive voltage $V_{GS}$ in the off-state the greater the magnitude of the load path voltage $V_{DS}$ and the losses. In the second off-state, the difference between the threshold voltage $V_{TH}$ and the drive voltage $V_{GS}$ is lower than in the first off-state so that in the second off-state the transistor device 1 may be operated in the reverse conducting mode at lower losses than in the first off-state.

In the third off-state, the difference between the threshold voltage $V_{TH}$ and the drive voltage $V_{GS}$ is higher than in the second off-state in order to safely keep the transistor device 1 in the off-state after the maximum time period $T_{MAX}$.

Figure 5:
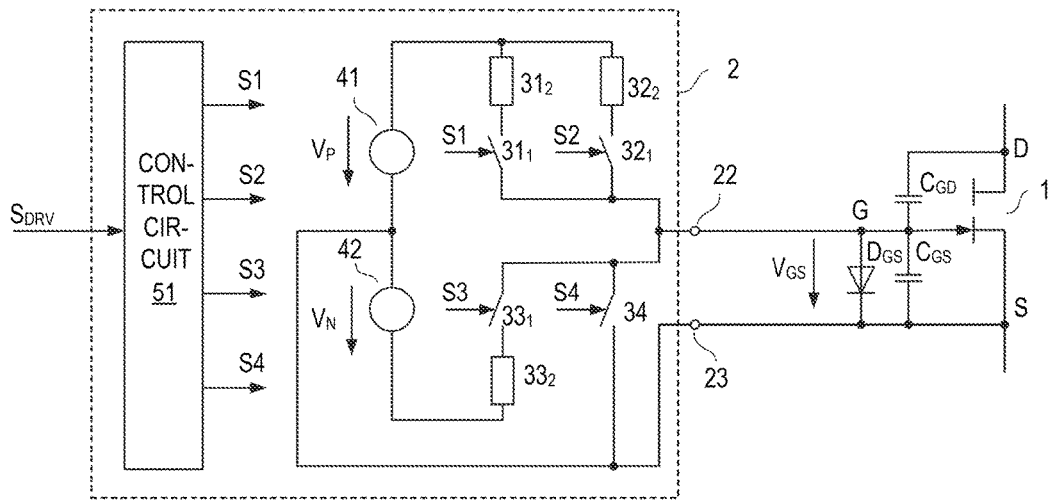
FIG. 5 shows one example of a drive circuit configured to operate in accordance with the method illustrated in FIG. 3.

FIG. 5 shows one example of a drive circuit 2 configured to generate the drive voltage $V_{GS}$ based on the drive signal $S_{DRV}$ in accordance with the method explained with reference to FIGS. 3, 4A and 4B. Referring to FIG. 5, the drive circuit 2 includes a first voltage source 41 connected between the second output node 23 of the drive circuit 2 and a parallel circuit, wherein the parallel circuit is connected to the first output node 22. The parallel circuit includes two series circuits, a first series circuit with a first electronic switch $31_1$ and a first resistor $31_2$, and a second series circuit with a second electronic switch $32_1$ and a second resistor $32_2$. The first switch $31_1$ is driven by a first drive signal S1, and the second switch $32_1$ is driven by a second drive signal S2. Each of these drive signals S1, S2 is generated by a control circuit 51 based on the drive signal $S_{DRV}$. The drive circuit 2 further includes a second voltage source 42 connected in series with a third electronic switch $33_1$ and a third resistor $33_2$, wherein the series circuit with the second voltage source 42, the third electronic switch $33_1$ and the third resistor $33_2$ is connected between the first output node 22 and the second output node 23. Further, a fourth electronic switch 34 is connected between the first output node 22 and the second output node 23. The third electronic switch $33_1$ is driven by a third drive signal S3, and the fourth electronic switch 34 is driven by a fourth drive signal S4. Each of these third and fourth drive signals S3, S4 is generated by the control circuit 51 dependent on the drive signal $S_{DRV}$.

The transistor device 1 includes internal (parasitic) capacitances and an internal diode. These circuit elements are illustrated in FIG. 5. Specifically, the transistor device 1 includes a gate-source capacitance $C_{GS}$ between the gate node G and the source node S, a gate-source diode $D_{GS}$ between the gate node G and the source node S, and a gate-drain capacitance $C_{GD}$ between the gate node G and the drain node D. In order to switch on the transistor device 1, the gate-source capacitance $C_{GS}$ has to be charged such that the gate-source voltage (drive voltage) $V_{GS}$ is higher than the threshold voltage of the transistor device 1. Further, in order to keep the transistor device in the on-state, a gate-source current via the gate-source diode $D_{GS}$ is required. A forward voltage of this gate-source diode $D_{GS}$ is higher than the threshold voltage $V_{TH}$ of the transistor device so that a current flowing through the gate-source diode $D_{GS}$ maintains the transistor device 1 in the on-state.

Figure 6:
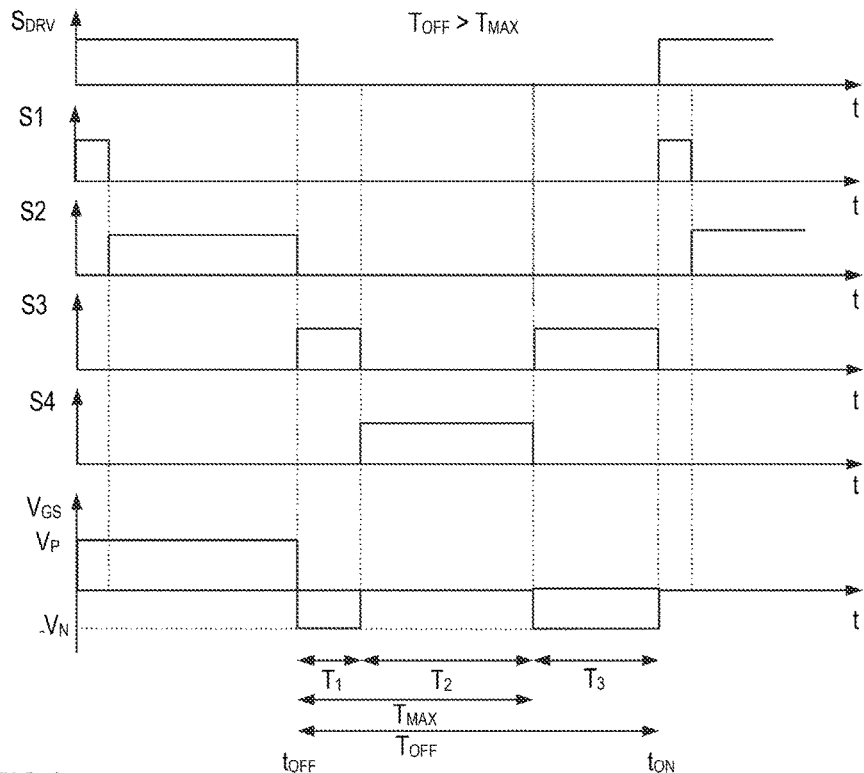
FIG. 6 shows examples of signal waveforms of signals occurring in the drive circuit shown in FIG. 5.

FIG. 6 illustrates the function of the drive circuit 2 shown in FIG. 5. For this, FIG. 6 shows signal waveforms of the drive signal $S_{DRV}$ received by the drive circuit 2, the drive signal S1-S4 generated by the control circuit 51 and received by the first, second, third and fourth switch $31_1$, $32_1$, $33_1$, 34, and the drive voltage $V_{GS}$. For the purpose of illustration it is assumed that the off-level of the drive signal $S_{DRV}$ prevails longer than the maximum time period $T_{MAX}$, so that the transistor device 1 successively is operated in the first off-state, the second off-state and the third off-state. Like in the example explained with reference to FIG. 4, $t_{OFF}$ denotes a time instance at which the signal level of the drive signal $S_{DRV}$ changes from the on-level to the off-level. Further, for the purpose of illustration, it is assumed that each of the control signals S1-S4 can have two different signal levels, an on-level that switches on the respective switch and an off-level that switches off the respective switch. Just for the purpose of illustration, it is assumed that the on-level is a high signal level and the off-level is a low signal level.

Referring to FIG. 6, in the first off-state, the control circuit 51 switches on the third electronic switch $33_1$ and switches off the other electronic switches so that in the first off-state, via the third electronic switch $33_1$, the series circuit with the second voltage source 42 and the third resistor $33_2$ is connected between the first output node 22 and the second output node 23 and, therefore, between the gate node G and the source node S of the transistor device 1. According to one example, the second voltage source 42 is configured to generate a substantially constant voltage with a voltage level $V_N$. Further, in the example shown in FIG. 5, a series circuit with the second voltage source 42, the third resistor $33_2$ and the third electronic switch $33_1$ is connected between the first and second output nodes 22, 23 such that the drive voltage $V_{GS}$ substantially equals minus the second supply voltage $V_N$, that is, $V_{GS} = -V_N$, when the third electronic switch $33_1$ is switched on and the electronic circuit is in the steady state. The electronic circuit is in the steady state when the gate-source capacitance $C_{GS}$ has been discharged such that the gate-source voltage $V_{GS}$ substantially equals $-V_N$. Discharging the gate-source capacitance when the electronic circuit enters the first off-state is governed by a resistance of the third resistor $33_2$. According to one example, a time constant of an RC circuit formed by the gate-source capacitance $C_{GS}$ and the third resistor $33_2$ is short as compared to the first time period $T_1$ so that discharging the gate-source capacitance at the beginning of the first off-state is not explicitly illustrated in the signal waveforms shown in FIG. 6.

Referring to FIG. 6, in the second off-state, the control circuit 51 switches off the third electronic switch $33_1$ and switches on the fourth electronic switch 34. This causes the drive voltage $V_{GS}$ to decrease to zero. If, as illustrated in FIG. 6, the off-level of the drive signal $S_{DRV}$ prevails longer than the maximum timer period $T_{MAX}$, the electronic circuit enters the third off-state, that is, the transistor device 3 is driven in the third off-state. In the third off-state, the drive voltage $V_{GS}$ is generated in the same way as in the first off-state. That is the control circuit 51 switches on the third electronic switch $33_1$ and switches off the other electronic switches.

When the signal level of the drive signal $S_{DRV}$ changes from the off-level to the on-level, as illustrated at time instance $t_{ON}$ in FIG. 6, the control circuit switches on the first electronic switch $31_1$ and switches off the other electronic switches. This is independent of whether the transistor device 1 has been operated in the second off-state or the third off-state. When the first switch $31_1$ is in the on-state, the series circuit with the first voltage source 41 and the first resistor $31_2$ is connected between the gate node G and the source node S. A resistance of the first resistor $31_2$ is selected such that the gate-source capacitance $C_{GS}$ is rapidly charged to above the threshold voltage in order to rapidly switch on the transistor device 1. According to one example, the first switch $31_1$ is switched on for a predefined time period. After this predefined time period, the control circuit 51 switches off the first electronic switch $31_1$ and switches on the second electronic switch $32_1$ until the signal level of the drive signal $S_{DRV}$ again changes to the off-level. A resistance of the second resistor $32_2$ is higher than the resistance of the first resistor $31_2$, so that in the on-state of the second electronic switch $32_1$ a lower current than in the on-state of the first electronic switch $31_1$ flows into the gate node G. The current provided by the series circuit with the first voltage source 41, and the second resistor $32_2$ in the on-state of the second electronic switch $32_1$ is such that it keeps the transistor device 1 in the on-state.

According to one example, a ratio $R32_2:R32_1$ between a second resistance $R32_2$ of the second resistor $32_2$ and a first resistance R321 of the first resistor $32_1$ is selected from between 200:1 and 50:1, in particular between 120:1 and 80:1. The first resistance is several ohms, such as between 1 ohm and 10 ohms, for example. According to one example, the first resistance $R32_1$ and the gate-source capacitance $C_{GS}$ are adapted to one another such that a time constant of an RC element formed by the gate source capacitance $C_{GS}$ and the first resistor $32_1$ when the first switch $31_1$ is switched on is about several nanoseconds, such as between 1 and 10 nanoseconds in order to rapidly charge the gate-source capacitance $C_{GS}$.

Figure 7:
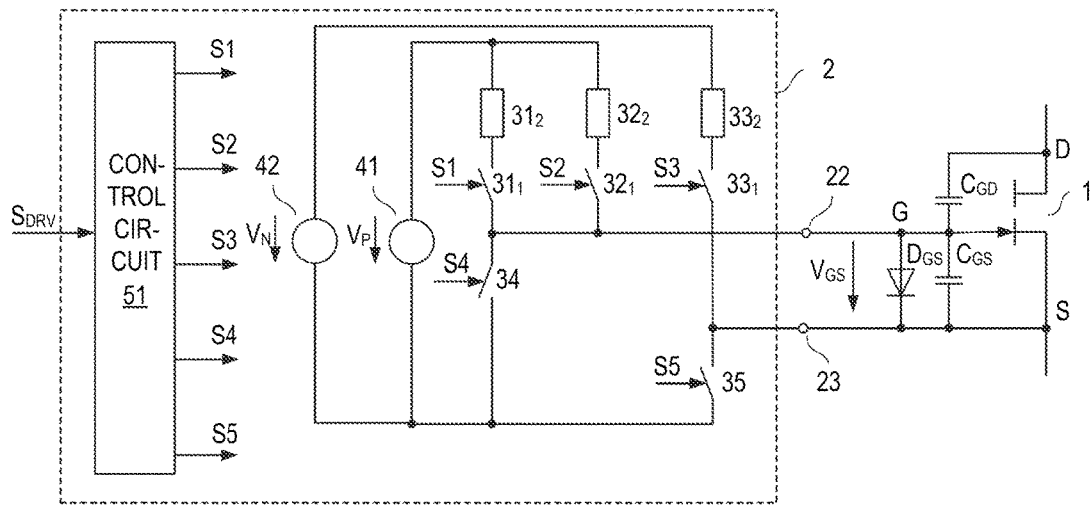
FIG. 7 shows another example of a drive circuit configured to operate in accordance with the method illustrated in FIG. 3.

FIG. 7 shows a modification of the drive circuit 2 shown in FIG. 5. While in the drive circuit shown in FIG. 5, first and second voltage source 41, 42 are connected in series such that a negative pole of the first voltage source 41 is connected to a positive pole of the second voltage source 42 and a tap between the first voltage source 41 and the second voltage source 42 is connected to the second output node 23, in the drive circuit 2 shown in FIG. 7 negative poles of the first voltage source 41 and the second voltage source 42 are connected to each other and these negative poles are connected to the second output node 23 via a fifth electronic switch 35 driven by a drive signal S5 generated by the control circuit 51. The fourth electronic switch 34 is connected in series with this fifth electronic switch 35 so that a series circuit with the fourth electronic switch 34 and the fifth electronic switch 35 is connected between the first output node 22 and the second output node 23. Like in the example shown in FIG. 5, the first voltage source 41 is connected in series with the parallel circuit that includes the first series circuit with the first electronic switch $31_1$ and the first resistor $31_2$ and the second series circuit with the second electronic switch $32_1$ and the second resistor $32_2$. This parallel circuit is connected between the first voltage source 41 and the second output node 22. The second voltage source 42 is connected in series with the third electronic switch $33_1$ and the third resistor $33_2$.

Figure 8:
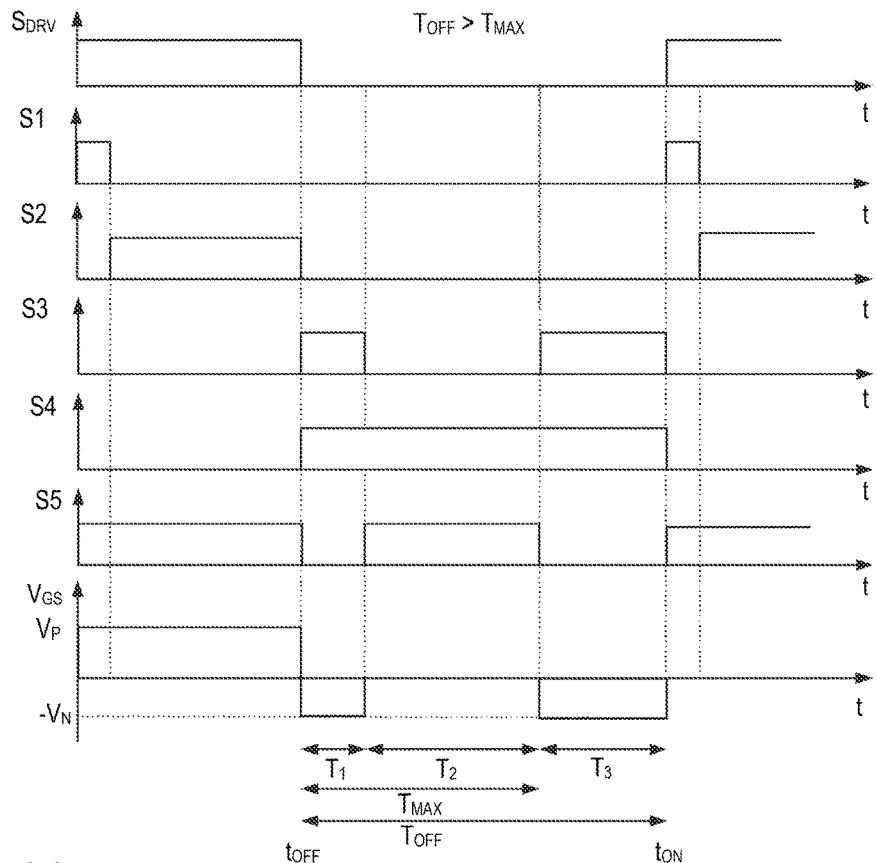
FIG. 8 shows examples of signal waveforms of signals in the drive circuit shown in FIG. 7.

The function of the drive circuit 2 shown in FIG. 7 is illustrated in FIG. 8 that shows signal waveforms of the drive signal $S_{DRV}$, the drive voltage $V_{GS}$ and the control signals S1-S5 received by the first, second, third, fourth and fifth electronic switch $31_1$, $32_1$, $33_1$, 34, 35. In the on-state, the drive circuit 2 shown in FIG. 7 operates very similar to the drive circuit 2 shown in FIG. 5. That is, the control circuit 51 at the beginning of the on-state switches on the first electronic switch $31_1$ for a predefined time period and then switches off the first electronic switch $31_1$ and switches on the second electronic switch $32_1$. Additionally, during the on-state, the control circuit 51 switches on the fifth electronic switch 35 in order to connect the first voltage source 41 to the first and second output nodes 22, 23. In the first off-state, the control circuit switches on the third electronic switch $33_1$ and the fourth electronic switch 34 in order to connect the second voltage source 42 to the first and second output nodes 22, 23 such that in the steady state, the drive voltage $V_{GS}$ equals the inverted supply voltage $-V_N$ of the second voltage source 42. In the third off-state, the drive circuit 2 operates in the same way as in the first off-state. In the second off-state, the control circuit 51 switches on the fourth electronic switch 34 and the fifth electronic switch 35 in order to connect the first output node 22 and the third output node 23.

In each of the drive circuits 2 shown in FIGS. 5 and 7, the timing of the two or three off-states is governed by the control circuit 51. That is, the control circuit 51 defines the duration of the first time period $T_1$ and the maximum time period $T_{MAX}$ after which the electronic circuit enters the third off-state.

Figure 9:
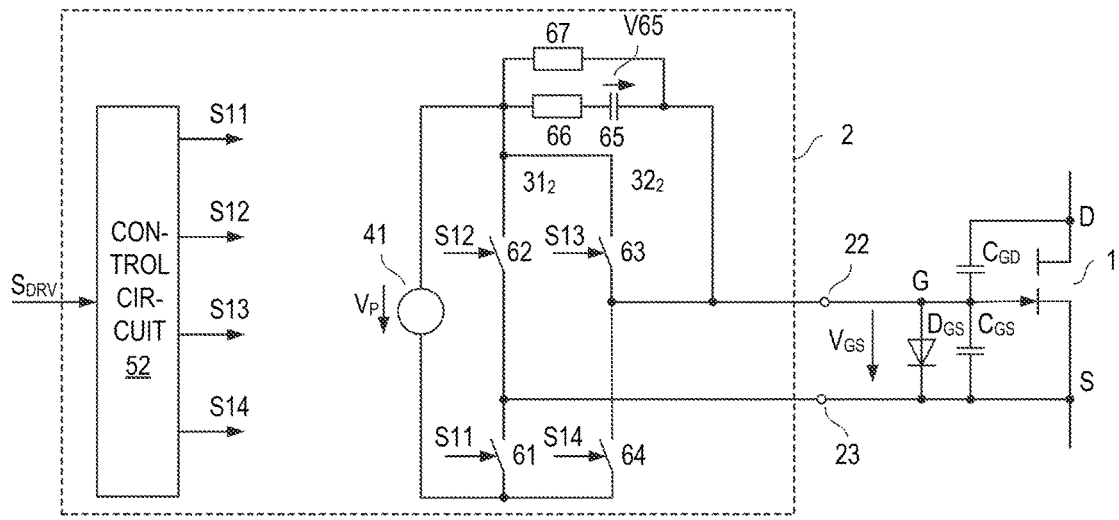
FIG. 9 shows yet another example of a drive circuit configured to operate in accordance with the method illustrated in FIG. 3.

FIG. 9 shows a drive circuit 2 according to another example. This drive circuit 2 is different from the drive circuits according to FIGS. 5 and 7 in that it includes only one voltage source 41 and additionally includes an RC circuit with one capacitor 65 and two resistors 66, 67. One resistor 66, which is referred to as first resistor 66 in the following, is connected in series with the capacitor 65. The other resistor 67 is connected in parallel with the series circuit that includes the capacitor 65 and the first resistor 66. The RC-circuit with the capacitor 65 and the first and second resistors 66, 67 are connected in series with the voltage source 41.

The drive circuit 2 shown in FIG. 9 further includes a switch circuit with four switches 61, 62, 63, 64. These switches 61-64 are driven by drive signals S11-S14 generated by a control circuit 52 dependent on the drive signal $S_{DRV}$. In the example shown in FIG. 9, the RC-circuit 65, 66, 67 is connected between the voltage source 41 and the first output node 22. The first switch 61 is connected between the second output node 23 and the voltage source 41. The second switch 62 is connected between the second output node 23 and a circuit node (tap) between the voltage source 41 and the RC-circuit. A third electronic switch 63 is connected in parallel with the RC-circuit, and the fourth electronic switch 64 is connected between the first output node 22 and the voltage source 41.

Figure 10:
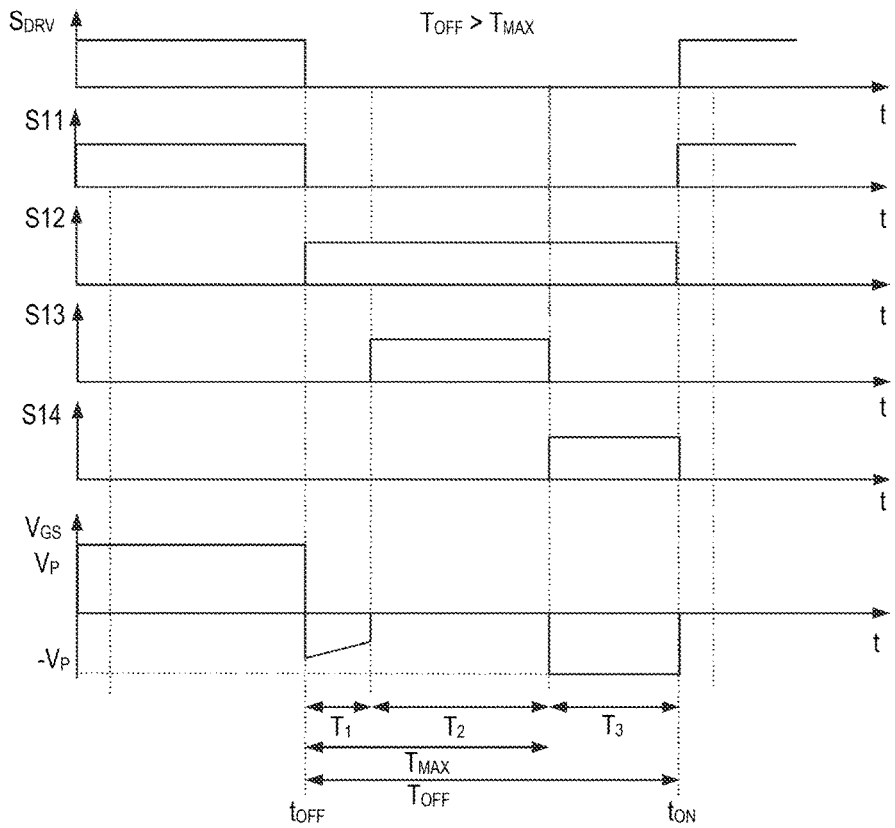
FIG. 10 shows examples of signal waveforms of signals occurring in the drive circuit shown in FIG. 9.

The function of the drive circuit 2 shown in FIG. 9 is explained below with reference to FIG. 10 that shows signal waveforms of the drive signal $S_{DRV}$, the control signals S11-S14 received by the switches 61-64, and the drive voltage $V_{GS}$. Referring to FIG. 10, in the on-state, that is, when the drive signal $S_{DRV}$ has the on-level, the control circuit 52 switches on the first electronic switch 61 and switches off the other electronic switches, so that in the on-state the series circuit with the drive voltage 41 and the RC-circuit 65-67 is connected between the output nodes 22, 23 and, therefore, in parallel with the drive path G-S of the transistor device 1. At the beginning of the on-state, the gate-source capacitance $C_{GS}$ is rapidly charged via the series circuit with the capacitor 65 and the first resistor 66 in order to rapidly switch on the transistor device 1. The drive voltage $V_{GS}$ generated by the series circuit with the first resistor 66, the capacitor 65 and the gate-source capacitance $C_{GS}$ is substantially given by a forward voltage of the gate-source diode DGs, wherein this forward voltage is higher than the threshold voltage $V_{TH}$ of the transistor device. That is, the drive voltage $V_{GS}$, in the on-state, is substantially clamped by the forward voltage of the gate-source diode DGs. According to one example, a resistance of the first resistor 66 is selected such that an RC circuit formed by the first resistor 66, the capacitor 65 and the gate-source capacitance has a time constant of several nanoseconds, such as between 1 and 10 nanoseconds in order to rapidly charge the gate-source capacitance $C_{GS}$ after the first electronic switch 11 switches on.

The gate current required to keep the transistor device 1 in the on-state, is provided via the second resistor 67 connected in parallel with the capacitor 65 and the first resistor 66. A second resistance R67 of the second resistor 67 may be significantly higher than a first resistance of a first resistor 66. According to one example, a ratio R67:R66 between the second resistance R67 and the first resistance R66 is selected from between 200:1 and 50:1, in particular between 120:1 and 80:1.

In the on-state of the transistor device 1, the capacitor 65 and the gate-source capacitance $C_{GS}$ are charged, wherein in a steady state a voltage V65 across the capacitor 65 is substantially given by the gate current flowing through the gate-source diode $D_{GS}$ multiplied with the second resistance. When the electronic circuit enters the first off-state based on the drive signal $S_{DRV}$, the control circuit 52 switches off the first switch 61 and switches on the second switch 62 in order to connect the RC circuit between the first output node 22 and the second output node 23 and, therefore, in parallel with the gate-source capacitance $C_{GS}$. After the RC circuit has been connected in parallel with the gate-source capacitance $C_{GS}$ there are substantially two phases. In a first phase, a charge balancing between the capacitor 65 and the gate-source capacitance takes place such that after the charge balancing the drive voltage $V_{GS}$ is substantially given by $$V_{GS} = \frac{-Q65 + Q_{GS}}{C65 + C_{GS}}, \quad (1)$$

where Q65 is the charge stored in the capacitor 65 and $Q_{GS}$ is the charge stored in the gate-source capacitance $C_{GS}$ before the second switch 62 switches on. These charges are given by Q65=V65·C65 and $Q_{GS}=V_{GS}·C_{GS}$ so that the voltage V65 across the capacitor 65 and the drive voltage $V_{GS}$ before the second switch 62 switches on and the capacitance C65 of the capacitor 65 and the gate-source capacitance $C_{GS}$ define these charges Q65 and $Q_{GS}$. The voltage V65 across the capacitor 65 in the on-state, that is before, the second switch 62 switches on is substantially given by the voltage $V_P$ provided by the voltage source 41 minus the forward voltage VF of the gate-source diode, so that V65=$V_P$-$V_F$. According to one example, these parameters C65, $C_{GS}$, V65, $V_{GS}$ are adapted to one another such that the charge Q65 stored in the capacitor is greater than the charge $Q_{GS}$ stored in the gate-source capacitance $C_{GS}$ so that the drive voltage as defined by equation (1) is negative. According to one example, a time constant of an RC circuit that includes the capacitor 65, the gate-source capacitance $C_{GS}$ and the first resistor after the second switch 62 has been switched is several nanoseconds, such as between 1 and 10 nanoseconds, so that the charge balancing rapidly takes place. In a second phase (which actually starts at the same as the first phase but does not significantly affect the charge balancing) the parallel circuit with the capacitor 65 and the gate source capacitance $C_{GS}$ are discharged via the second resistor 67 so that the magnitude of the (negative) drive voltage decreases. As, referring to the above, the first resistance R66 may be significantly smaller than the second resistance R67, the first resistance 66 does not significantly affect this discharging and a time constant of an RC circuit that includes the capacitor 65, the gate-source capacitance $C_{GS}$ and the second resistor 67 is larger than the time constant of the RC circuit that includes the capacitor 65, the gate-source capacitance $C_{GS}$ and the first resistor 66 so that this discharging is slower than the charge balancing. Discharging the capacitor 65 and the gate-source capacitance $C_{GS}$ causes a magnitude of the (negative) drive voltage $V_{GS}$ to slowly decrease. Such decrease, which follows an exponential relationship, is only schematically illustrated in FIG. 10.

In the second off-state, the control circuit 52, additionally to the second switch 62, switches on the third switch 63 in order to bypass the RC-circuit and directly connect the first output node 22 and the second output node 23, so that the drive voltage $V_{GS}$ is substantially zero.

In the third off-state, the control circuit switches on the second electronic switch 62 and the fourth electronic switch 64 in order to connect the voltage source 41 between the first output node 22 and the second output node 23 such that the drive voltage $V_{GS}$ equals the inverted supply voltage, that is, $V_{GS}$=-$V_P$.

Figure 11:
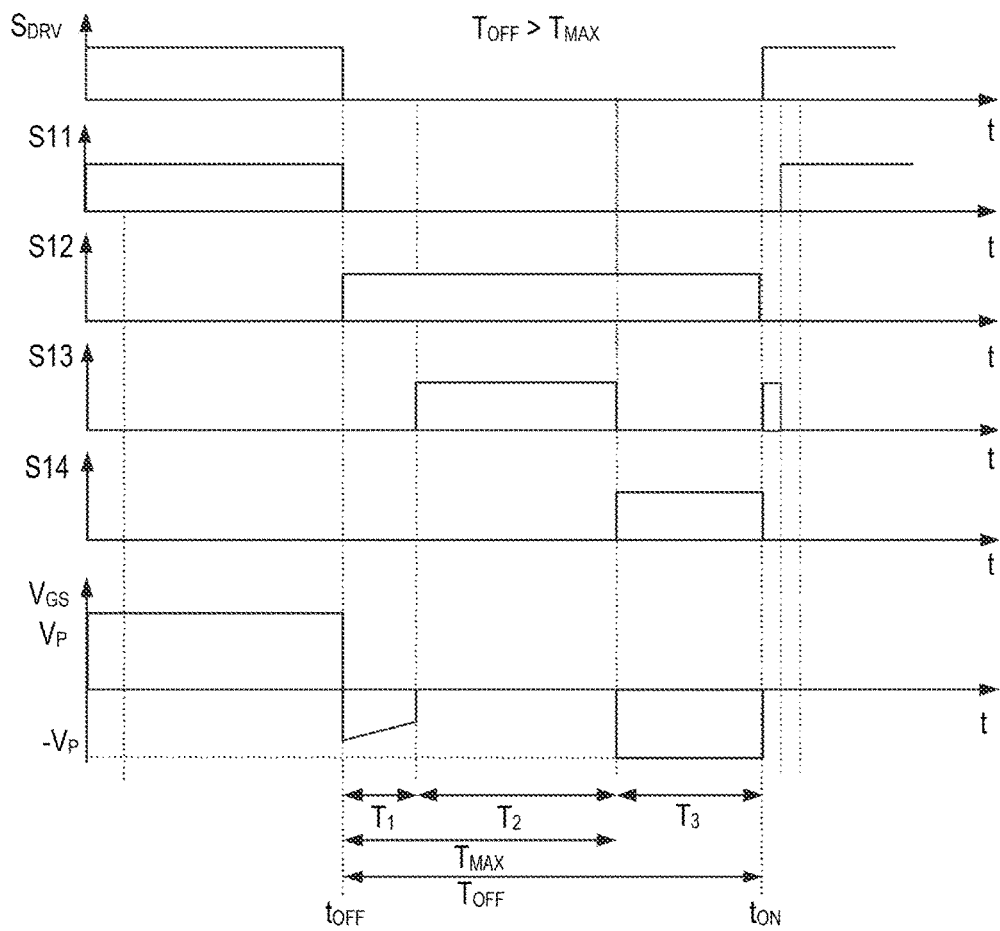
FIG. 11 shows signal waveforms that illustrate a modification of the method illustrated in FIG. 10.

FIG. 11 illustrates a modification of the method shown in FIG. 10. In this method, when the drive signal $S_{DRV}$ changes from the off-level to the on-level and the transistor device 1 has been operated in the third off-state, the transistor device 1 is operated in the second off-state for a predefined time period. This discharges the gate-source capacitance $C_{GS}$ and, in particular, the capacitor 65. Thus, the capacitor 65 is discharged before the beginning of the on-state and, at the beginning of the on-state, may help to rapidly charge the gate-source capacitance $C_{GS}$ as explained above.

Figure 12A:
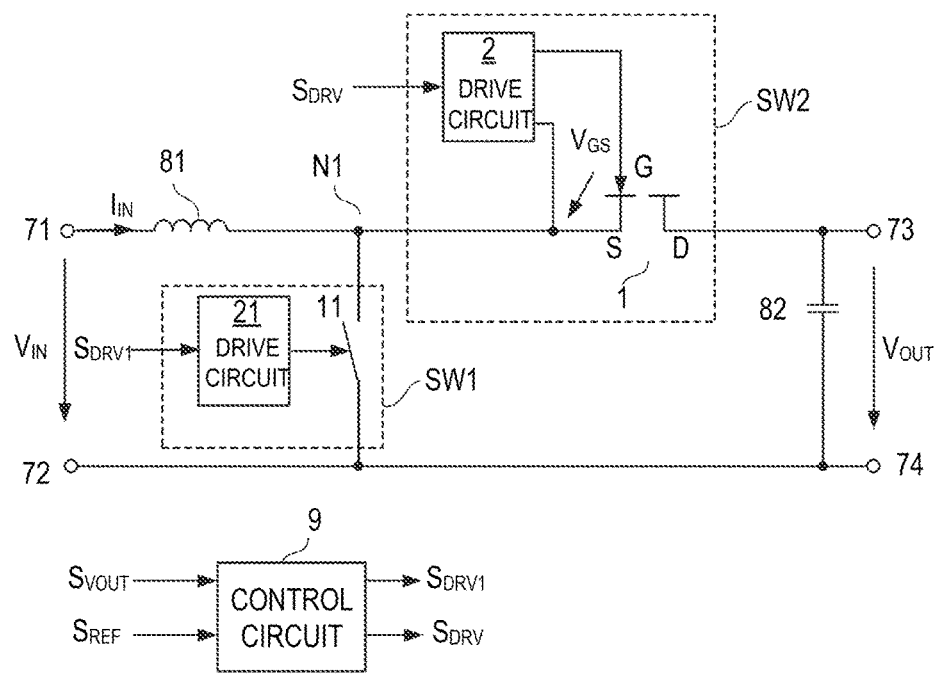
FIGS. 12A and 12B show two examples of power converters that each include an electronic circuit of the type shown in FIG. 1 and an electronic switch.
Figure 12B:
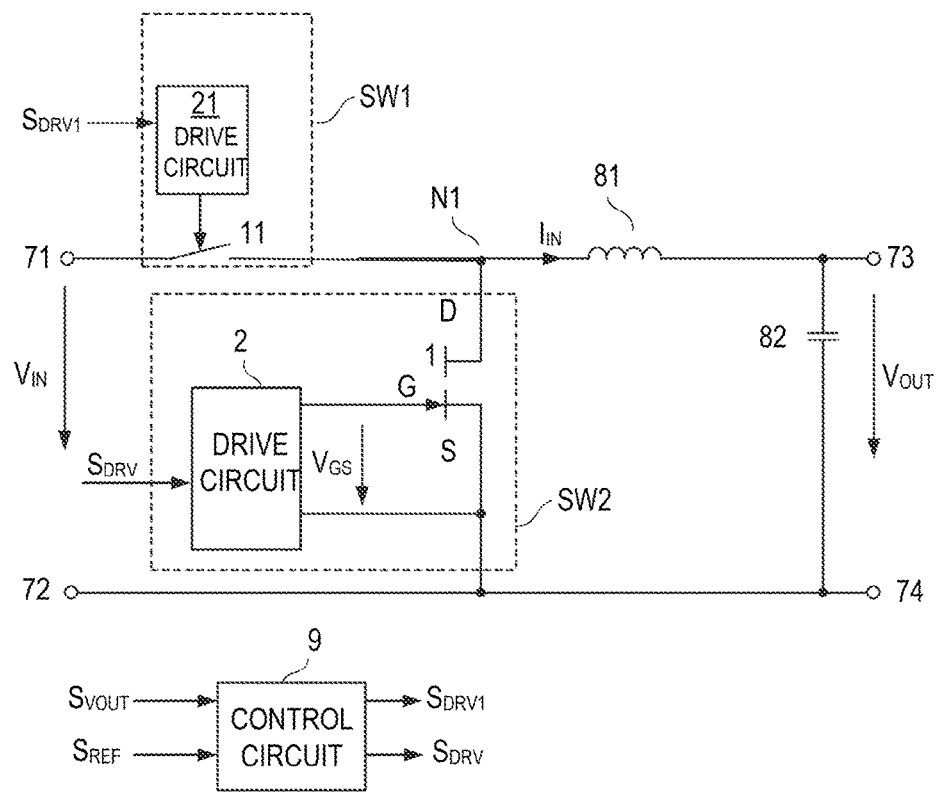

Referring to the above, the electronic circuit with the transistor device 1 and the drive circuit 2 may be used as an electronic switch. FIGS. 12A and 12B show two different examples of power converters that include two electronic switches, a first electronic switch SW1 and a second electronic SW2, wherein at least the second electronic switch SW2 is implemented with an electronic circuit explained above that includes a transistor device 1 and a drive circuit 2 configured to drive the transistor device 1 based on a corresponding drive signal $S_{DRV}$ in accordance with one of the methods explained above. The drive circuit 2 may be implemented in accordance with one of the examples explained with reference to FIGS. 5, 7, and 9. The first electronic switch SW1 includes a switching device 11 and a drive circuit 21 configured to drive the switching device 11 based on a drive signal $S_{DRV1}$. According to one example, the first switching device SW1 is implemented in the same way as the second switching device SW2. In this case, the switching device 11 is a transistor device and the drive circuit 21 is implemented in accordance with the drive circuit 2 explained above and drives the transistor device in accordance with the method explained above. This, however, is only an example, any other type of switching device or any other type of drive circuit may be used as well.

In each of the power converters shown in FIGS. 12A and 12B, the second electronic switch SW2 acts as an active freewheeling device, which may also be referred to as synchronous rectifier (SR) device. Thus, the second electronic switch SW2 may also be referred to as SR switch SW2, and the first electronic switch SW1 may simply be referred to as electronic switch SW1.

Each of the power converters includes an inductor 81 coupled to the first switch SW1 and the second switch SW2, and a control circuit 9. The control circuit 9 is configured to generate the drive signals $S_{DRV1}$, $S_{DRV}$ received by the first and second electronic switches SW1, SW2. These drive signals $S_{DRV1}$, $S_{DRV}$ are referred to as first and second drive signals in the following. The control circuit 9 may be a conventional control circuit configured to generate drive signals for an electronic switch and an SR switch in a power converter. In particular, the control circuit 9 may be configured to drive the first and second switches SW1, SW2 in a plurality of successive drive cycles such that, in each of the drive cycle, it switches on the first switch SW1 for a first on-period while the second switch is in the off-state, and switches on the second switch SW2 for a second on-period while the first switch SW1 is in the off-state. This way of operating the first and second electronic switch SW1, SW2 may be referred to as switched-mode operation.

Figure 13:
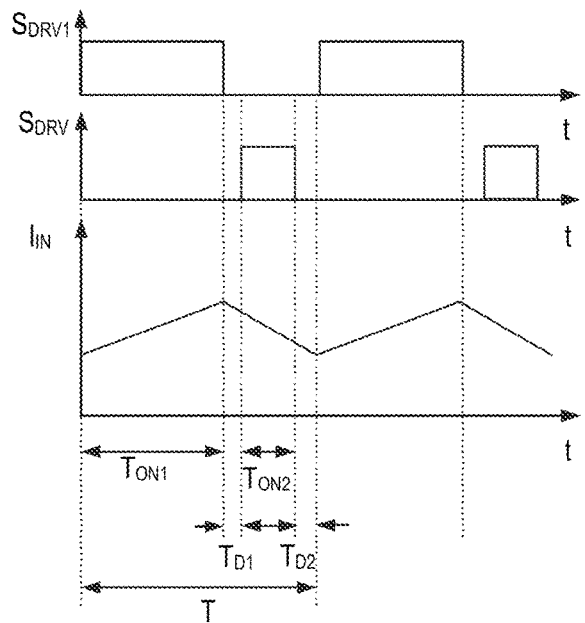
FIG. 13 shows signal waveforms that illustrate operation of the electronic circuit and the electronic switch shown in FIGS. 12A and 12B.

Such switched-mode operation of the first switch SW1 and the second switch SW2 is illustrated in FIG. 13 that shows signal waveforms of the first and second drive signals $S_{DRV1}$, $S_{DRV}$ and an input current $I_{IN}$. Referring to FIGS. 12A and 12B, the input current $I_{IN}$ is the current through the inductor 81. Each of the first and second drive signals $S_{DRV1}$, $S_{DRV}$ can have an on-level that switches on the respective switch and an off-level that switches off the respective switch. Just for the purpose of illustration, an on-level is a high signal level and an off-level is a low signal level in the example shown in FIG. 13.

In each of the circuits shown in FIGS. 12A and 12B the inductor 81, the first switch SW1 and the second switch SW2 are connected such that the input current $I_{IN}$ increases and flows through the first electronic switch SW1 when the first electronic switch SW1 is in the on-state and decreases and flows through the second switch SW2 when the first electronic switch SW1 is in the off-state. This is also illustrated in FIG. 13. Just for the purpose of illustration it is assumed that the power converters operate in the continuous conduction mode (CCM) which is an operation mode in which the inductor current $I_{IN}$ does not decrease to zero when the first electronic switch SW1 is in the off-state. This, however, is only an example. According to another example (not shown) the power converters operate in a discontinuous current mode (DCM). In the DCM, the input current $I_{IN}$ decreases to zero during the off-state of the first switch SW1.

Referring to FIGS. 12A and 12B, the first switch SW1 and the second switch SW2 are connected at a circuit node N1. According to one example, in order to prevent a cross current, the control circuit 9 is configured to generate the first and second drive signals $S_{DRV1}$, $S_{DRV}$ such that there is a dead time $T_{D1}$, $T_{D2}$ between generating an off-level of one of the first and second drive signals $S_{DRV1}$, $S_{DRV}$ and generating an on-level of the other one of the first and second drive signals $S_{DRV1}$, $S_{DRV}$ so that during the dead times $T_{D1}$, $T_{D2}$ both of the first and second drive signals $S_{DRV1}$, $S_{DRV}$ have an off-level. A dead time between the on-level of the first drive signal $S_{DRV1}$ and the on-level of the second drive signal $S_{DRV}$ is referred to as first dead time in the following, and a dead time between the on-level of the second drive signal $S_{DRV}$ and the on-level of the first drive signal $S_{RDV1}$ is referred to as second dead time in the following.

The power converter shown in FIG. 12A is a boost converter which, additionally to the first and second switches SW1, SW2 and the inductor 81 includes a capacitor 82 referred to as output capacitor 82 in the following. The power converter is configured to receive an input voltage $V_{IN}$ between a first input node 71 and a second input node 72 and generate an output voltage $V_{OUT}$ between a first output node 73 and a second output node 74 based on the input voltage, wherein a voltage level of the output voltage $V_{OUT}$ may be higher than a voltage level of the input voltage $V_{IN}$. The second output node 74 equals the second input node 72 in this example. A series circuit with the inductor 81 and a load path of the switching device 11 in the first electronic switch SW1 is connected between the first input node 71 and the second input node 72. The output capacitor 82 is connected between the first and second output node 73, 74. A load path of the transistor device 1 in the second electronic switch SW2 is connected between the inductor 81 and the output capacitor 82 and is connected to the inductor 81 and the first switch SW1 at circuit node N1.

The power converter shown in FIG. 12B is a buck converter. This buck converter is different from the boost converter shown in FIG. 12A in that the first switch SW1 is connected between the first input node 71 and the circuit node N1, the inductor 81 is connected between the circuit node N1 and the first output node 73, and the second switch SW2 is connected between the circuit node N1 and the second output node 74 (which equals the second input node 72).

In each of the circuits shown in FIGS. 12A to 12B, the control circuit 9 is configured to regulate the output voltage $V_{OUT}$ by regulating the input current $I_{IN}$ (inductor current) at least based on an output voltage signal $S_{VOUT}$ and a reference signal $S_{REF}$, wherein the output voltage signal $S_{VOUT}$ is dependent on the output voltage $V_{OUT}$ and may be proportional to the output voltage $V_{OUT}$, and the reference signal $S_{REF}$ represents a desired signal level of the output voltage. "At least based on an output voltage signal $S_{VOUT}$ and a reference signal $S_{REF}$" means that other parameters, such as an instantaneous voltage level, of the input voltage $V_{IN}$ may be considered by the control circuit 9 as well. Regulating the input current $I_{IN}$ by the control circuit may include increasing the duty cycle of the first drive signal $S_{DRV1}$ (and decreasing the duty cycle of the second drive signal $S_{DRV}$) for several drive cycles in order to increase the input current $I_{IN}$ or decreasing the duty cycle of the first drive signal $S_{DRV1}$ (and increasing the duty cycle of the second drive signal $S_{DRV}$) for several drive cycles in order to decrease the input current $I_{IN}$. Referring to FIG. 13, the input current $I_{IN}$ in the CCM has a triangular waveform so that "to increase the input current $I_{IN}$" or "to decrease the input current $I_{IN}$" means to increase or decrease the medium (average) input current. The duty cycle of the first drive signal $S_{DRV1}$ is the ratio between the duration of the first on-period $T_{ON1}$ and a duration of one drive cycle T, and the duty cycle of the second drive signal $S_{DRV}$ is the ratio between the duration of the second on-period $T_{ON2}$ and the duration of one drive cycle T so that increasing the duty cycle of one of the first and second drive signals $S_{DRV1}$, $S_{DRV}$ decreases the duty cycle of the other one of the first and second drive signals $S_{DRV1}$, $S_{DRV}$.

The function of the power converters shown in FIGS. 12A and 12B in one drive cycle is as follows. When the first switch SW1 is in the on-state, energy is magnetically stored in the inductor 81, that is, the inductor 81 is magnetized. When the first switch SW1 switches off, by virtue of the energy stored in the inductor 81, the potential at the circuit node N1 increases in the boost converter shown in FIG. 12A or decreases in the buck converter shown in FIG. 12B until the second electronic switch SW2 in the first dead time $T_{D1}$ starts to conduct in the reverse conducting mode. After the first dead time $T_{D1}$ the second electronic switch SW2 conducts by virtue of being operated in the on-state by the on-level of the second drive signal $S_{DRV}$. Operating the second electronic switch SW2 in the reverse conducting mode means to operate the transistor device 1 in the reverse conducting mode.

Referring to the above, at least the second electronic switch SW2 is operated in accordance with the method explained above. According to one example, the first time period T1 and the maximum time period $T_{MAX}$ are dependent on a frequency range of a switching frequency of the first electronic switch SW1 and durations of the dead times $T_{D1}$, $T_{D2}$. The first switch SW1 may be operated at a fixed frequency or with a frequency varying between a minimum frequency $f_{MIN}$ and a maximum frequency $f_{MAX}$. According to one example, the maximum time period $T_{MAX}$ is adjusted such that it is greater than the reciprocal of the minimum switching frequency. In this case, the second electronic switch SW2 enters the third off-state if the second drive signal $S_{DRV}$ does not change to the on-level after a time period that equals or is greater than $1/f_{MIN}$, which is the duration of one drive cycle at the lowest switching frequency. According to one example, $T_{MAX}$ is selected from between 5 and 10 times $1/f_{MIN}$. According to one example, the first time period $T_1$ substantially equals a duration of the second dead time $T_{D2}$ so that the second electronic switch SW2 is in the first off-state during the second dead time. According to one example, a duration of the first time period $T_1$ is selected from between 1.1 times and 3 times a duration of the second dead time $T_{D2}$. During the first dead time $T_{D1}$, the second electronic switch SW2 is in the second off-state when the maximum time period $T_{MAX}$ is selected as outlined above.

Referring to the above, in the power converters shown in FIGS. 12A and 12B, the electronic circuit with the transistor device 1 and the drive circuit 2 acts as an SR switch SW2. Use of an electronic circuit of the type explained above as an SR switch, however, is not restricted to a power converter with a boost topology or a buck topology. Such electronic circuit may as well be used as an SR switch in any other type of power converter such as a flyback converter, a forward converter, an LLC converter, or the like.

Figure 14:
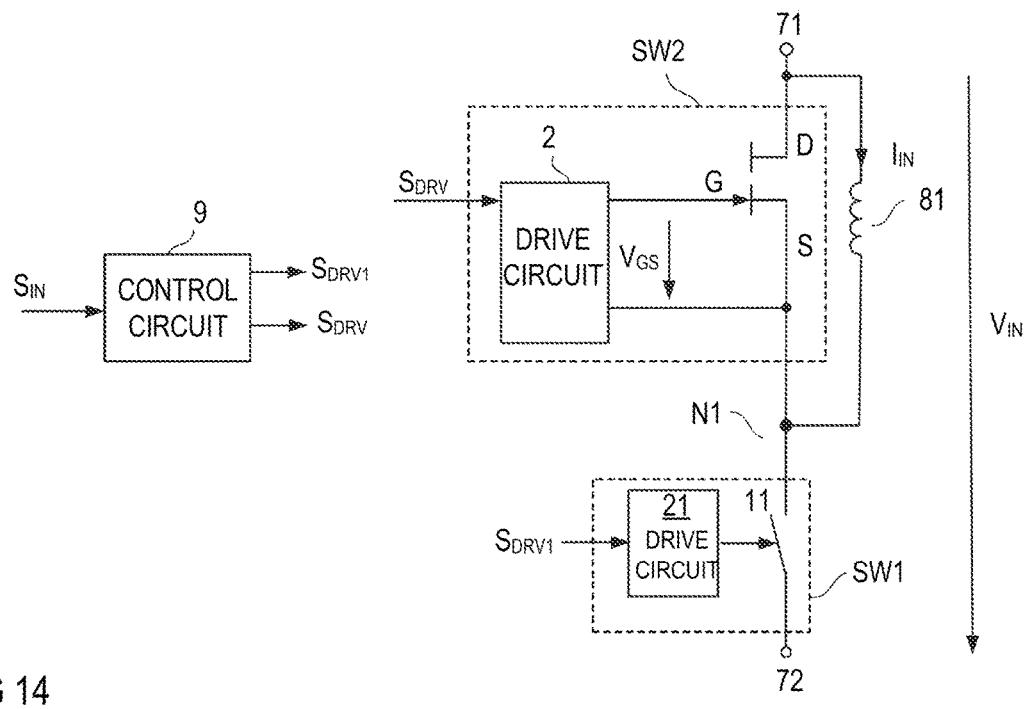
FIG. 14 shows another example of an electronic circuit that includes an electronic circuit of the type shown in FIG. 1 and an electronic switch.

Moreover, the electronic circuit may be used as an SR switch in any other type of circuit where the use of an SR switch is useful. Just as an example, FIG. 14 shows another example of an electronic circuit with an inductor 81 and first and second switches SW1, SW2. The inductor 81 may be part of an inductive load, such as a magnetic valve, and is connected in series with the first switch SW1, wherein the series circuit is connected between a first input node 71 and a second input node 72 that receive an input voltage $V_{IN}$. The second switch (SR switch SW2) is connected in parallel with the load 81 so that the two switches SW1, SW2 and the load 81 are connected at circuit node N1. A control circuit 9 switches on or off the first switch SW1 based on an input signal $S_{IN}$ and switches the second switch SW1 complementary to the first switch in the same way as illustrated in FIG. 13, so that there may be first and second dead times. Each time the first switch SW1 switches on it conducts a current through the inductive load 81, while the second switch SW2 takes over the current from the inductor 81 when the first switch SW1 switches off.

The invention claimed is:

1. A method comprising:
   driving a transistor device based on a drive signal such that the transistor device is driven in an on-state when the drive signal has an on-level and an off-state when the drive signal has an off-level,
   wherein driving the transistor device in the off-state comprises:
   operating the transistor device in a first off-state after the drive signal changes from the on-level to the off-level, wherein operating the transistor device in the first off-state comprises driving the transistor device with a first drive voltage,
   after the first off-state, operating the transistor device in a second off-state different from the first off-state, wherein operating the transistor device in the second off-state comprises driving the transistor device with a second drive voltage, the second drive voltage being different than the first drive voltage, and
   after the second off-state, operating the transistor device in a third off-state different from the second off-state in response to the off-level of the drive signal prevailing longer than a predefined maximum time period, wherein operating the transistor device in the third off-state comprises driving the transistor device with a third drive voltage, the third drive voltage being different than the second drive voltage,
   wherein a difference between a threshold voltage of the transistor device and the first drive voltage is greater than a difference between the threshold voltage and the second drive voltage, and
   wherein a difference between a threshold voltage of the transistor device and the third drive voltage is greater than the difference between the threshold voltage and the second drive voltage.

2. The method of claim 1,
   wherein operating the transistor device in the first off-state comprises operating the transistor device in the first off-state for a predefined first time period.

3. The method of claim 2, wherein the second drive voltage is substantially zero.

4. The method of claim 1,
   wherein driving the transistor device in the on-state comprises connecting a series circuit with a voltage source and an RC circuit between a control node and a first load node of the transistor device, wherein operating the transistor device in the first off-state comprises connecting the RC circuit between the control node and the first load node of the transistor device, and wherein operating the transistor device in the second off-state comprises connecting the control node and the first load node of the transistor device.

5. The method of claim 4, wherein operating the transistor device in the third off-state comprises connecting the voltage source between the control node and the gate node such that the drive voltage in the on-state and the drive voltage in the third off-state have opposite polarities.

6. The method of claim 1, wherein the transistor device is a high electron mobility transistor (HEMT).

7. The method of claim 1, the method further comprising:
in an electronic circuit that includes the transistor device and an electronic switch, operating the electronic switch in a plurality of successive drive cycles such that in each drive cycle it operates in an on-state and, after the on-state, in an off-state, and operating the transistor device such that the electronic switch and the transistor device are operated in the on-state alternately.

8. The method of claim 7, further comprising:
operating the transistor device in a first dead time between the on-state of the electronic switch and the on-state of the transistor device and a second dead time between the on-state of the transistor device and the on-state of the electronic switch, wherein a duration of the first dead time is selected from between 1.1 times and 2 times a duration of the second dead time.

9. The method of claim 7, wherein operating the electronic switch comprises operating the electronic switch at a switching frequency selected from between a minimum switching frequency and a maximum switching frequency, and wherein a duration of the maximum switching frequency is greater than a reciprocal of the minimum switching frequency.

10. The method of claim 9, wherein the duration of the maximum switching frequency is greater than 3 times a reciprocal of the minimum switching frequency.

11. A drive circuit configured to drive a transistor device based on a drive signal such that the transistor device is driven in an on-state when the drive signal has an on-level and an off-state when the drive signal has an off-level, wherein in the off-state the drive circuit is configured to drive the transistor device in a first off-state with a first drive voltage after the drive signal changes from the on-level to the off-level, after the first off-state, in a second off-state with a second drive voltage, wherein the second off-state is different from the first off-state and wherein the second drive voltage is different than the first drive voltage, and after the second off-state, in a third off-state with a second drive voltage, wherein the third off-state is different from the second off-state and the third drive voltage is different than the second drive voltage, wherein the transistor device is driven in the third off state in response to the off-level of the drive signal prevailing longer than a predefined maximum time period, wherein a difference between a threshold voltage of the transistor device and the first drive voltage is greater than a difference between the threshold voltage and the second drive voltage, and wherein a difference between a threshold voltage of the transistor device and the third drive voltage is greater than the difference between the threshold voltage and the second drive voltage.

12. The drive circuit of claim 11, wherein the drive circuit is configured to drive the transistor device in the first off-state for a predefined first time period.

13. The drive circuit of claim 11, wherein the second drive voltage is substantially zero.

14. The drive circuit of claim 12, wherein the drive circuit comprises an RC circuit and is configured to drive the transistor device in the on-state by connecting a series circuit with a voltage source and the RC circuit between a control node and a first load node of the transistor device, to drive the transistor device in the first off-state by connecting the RC circuit between the control node and the first load node of the transistor device, and to drive the transistor device in the second off-state by connecting the control node and the first load node of the transistor device.

15. The drive circuit of claim 14, wherein the drive circuit is further configured to drive the transistor device in the third off-state by connecting the voltage source between the control node and the gate node such that the drive voltage in the on-state and the drive voltage in the third off-state have opposite polarities.

16. The drive circuit of claim 14, wherein the RC circuit comprises:
a series circuit with a capacitor and a first resistor, and
a second resistor connected in parallel with the series circuit.

17. The drive circuit of claim 16, wherein a resistance of the second resistor is between 50 times and 200 times a resistance of the first resistor.

18. An electronic circuit, comprising:
a transistor device, wherein the transistor device is a high electron mobility transistor (HEMT); and
a drive circuit configured to drive the transistor device based on a drive signal such that the transistor device is driven in an on-state when the drive signal has an on-level and an off-state when the drive signal has an off-level, wherein in the off-state the drive circuit is configured to drive the transistor device in a first off-state after the drive signal changes from the on-level to the off-level, after the first off-state, in a second off-state different from the first off-state, and after the second off-state, in a third off-state different from the second off-state if the off-level of the drive signal prevails longer than a predefined maximum time period.

* * * * *